US012610814B2

(12) United States Patent
Chiu

(10) Patent No.: US 12,610,814 B2

(45) Date of Patent: Apr. 21, 2026

(54) ELECTRONIC FUSE DEVICE INCLUDING FUSE GATE, PASS GATE, AND DOPING REGIONS

(71) Applicant: NANYA TECHNOLOGY CORPORATION, New Taipei City (TW)

(72) Inventor: Hsih-Yang Chiu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 679 days.

(21) Appl. No.: 18/047,644

(22) Filed: Oct. 18, 2022

(65) Prior Publication Data

US 2024/0128188 A1 Apr. 18, 2024

(51) Int. Cl.
H10W 20/49 (2026.01)
H10W 42/80 (2026.01)

(52) U.S. Cl.
CPC ......... H10W 20/493 (2026.01); H10W 42/80 (2026.01)

(58) Field of Classification Search
CPC ................. H01L 23/5256; H01L 23/62; H01L 23/525–5258; H10B 20/20–25; G11C 17/14–165; H10W 42/80; H10W 20/493–494
See application file for complete search history.

(56) References Cited

U.S. PATENT DOCUMENTS

2022/0181336 A1* 6/2022 Chern ............... H01L 21/26513
2023/0402114 A1* 12/2023 Chiu ..................... G11C 17/16

* cited by examiner

*Primary Examiner* — Khaja Ahmad
*Assistant Examiner* — Candice Chan
(74) *Attorney, Agent, or Firm* — CKC & Partners Co., LLC

(57) ABSTRACT

An electronic fuse device includes a substrate, an insulating layer on the substrate, a first fuse gate, a first pass gate, and a first readout electrode. The substrate includes a first doping region, a second doping region, and a third doping region having a first conductivity type, and a highly doped region having a second conductivity type different from the first conductivity type. The first doping region is between the second doping region and the highly doped region. The second doping region is between the first doping region and the third doping region. The first fuse gate is on the insulating layer and between the first doping region and the second doping region. The first pass gate is on the insulating layer and between the second doping region and the third doping region. The first readout electrode is electrically connected to the third doping region.

9 Claims, 9 Drawing Sheets

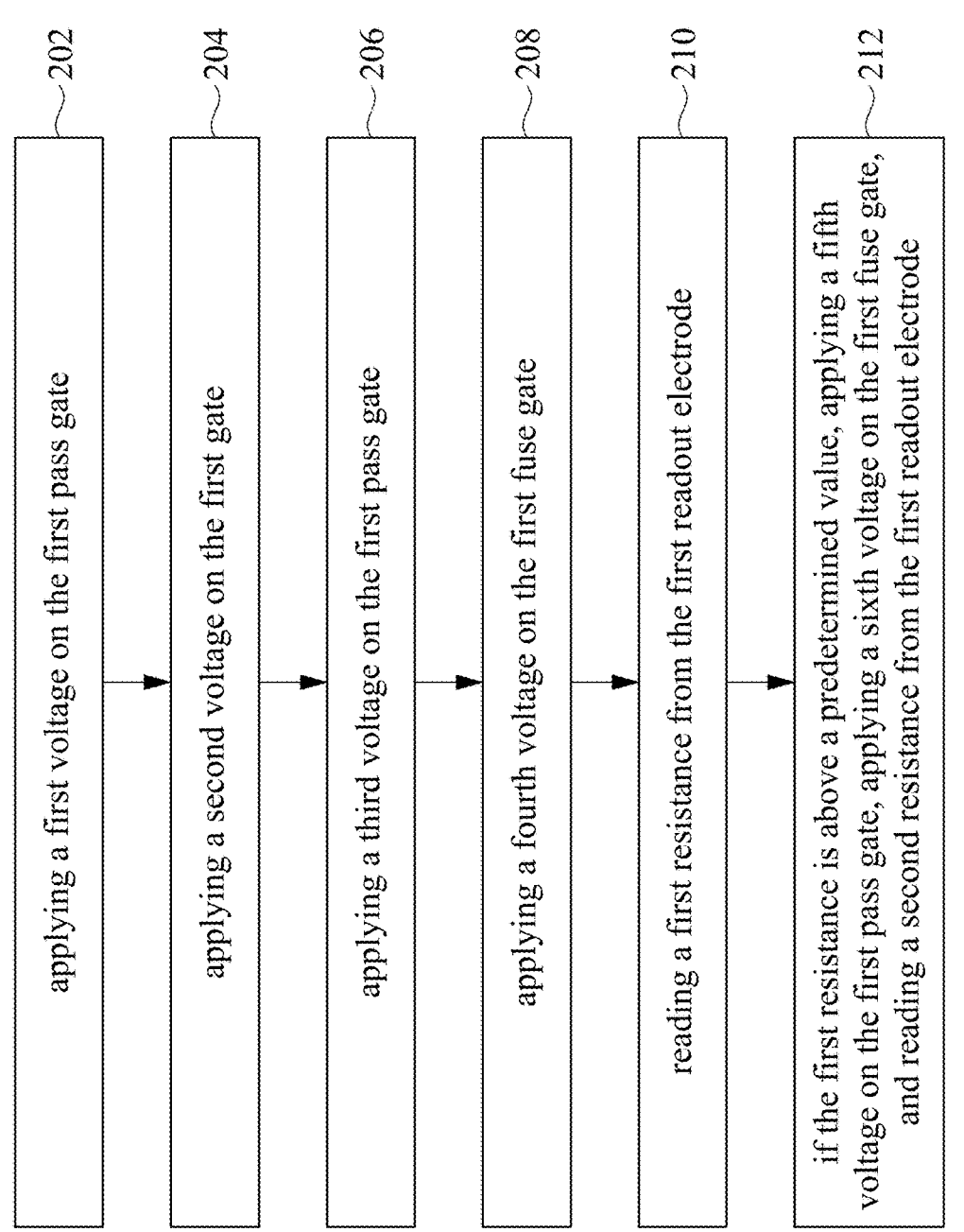

200

202 — applying a first voltage on the first pass gate

204 — applying a second voltage on the first gate

206 — applying a third voltage on the first pass gate

208 — applying a fourth voltage on the first fuse gate

210 — reading a first resistance from the first readout electrode

212 — if the first resistance is above a predetermined value, applying a fifth voltage on the first pass gate, applying a sixth voltage on the first fuse gate, and reading a second resistance from the first readout electrode

302 — forming a first fuse gate and a first pass gate

304 — performing a first ion implantation to form a first doping region, second doping region, and a third doping region 306 — performing a second ion implantation to form a highly doped region 308 — forming a first readout electrode electrically connected to the third doping region

ELECTRONIC FUSE DEVICE INCLUDING FUSE GATE, PASS GATE, AND DOPING REGIONS

BACKGROUND

Field of Invention

The present disclosure relates to an electronic fuse device, a method of measuring a resistance of the electronic fuse device, and a method of forming the electronic fuse device.

Description of Related Art

An electronic fuse (eFuse) is designed as a sacrificial component in electronic devices. Too much electric flow passing the electronic fuse causes the electronic fuse to blow. Besides protecting electronic devices from the damage of high electricity, the fused electronic fuse can change the electric flow pathway and therefore provides multiple operations on the electronic devices. For example, when parts of the device are not working efficiently, e.g., failure, longer responsive time, high power consumption, etc., electronic fuses in these parts are blown to ensure the device maintains performing efficiently. In some devices, electronic fuses are blown to write information saved permanently in the logic circuits, which prevents the possible downgrade on the device. Therefore, ensuring the electronic fuses meant to be blown are really fused in the device is important.

SUMMARY

The present disclosure provides an electronic fuse device. The electronic fuse device includes a substrate, an insulating layer, a first fuse gate, a first pass gate, and a first readout electrode. The substrate includes a first doping region, a second doping region, a third doping region, and a highly doped region, in which the first doping region is between the second doping region and the highly doped region, the second doping region is between the first doping region and the third doping region, the first doping region, the second doping region, and the third doping region are a first conductivity type, and the highly doped region is a second conductivity type different from the first conductivity type. The insulating layer is positioned on the substrate. The first fuse gate is disposed on the insulating layer and between the first doping region and the second doping region. The first pass gate is disposed on the insulating layer and between the second doping region and the third doping region. The first readout electrode is electrically connected to the third doping region.

In some embodiments, the first doping region is in direct contact with the highly doped region.

In some embodiments, the substrate further includes a well region surrounding the first doping region, the second doping region, and the third doping region, the well region has the second conductivity type, and a first doping concentration of the highly doped region is greater than a second doping concentration of the well region.

In some embodiments, the electronic fuse device further includes first spacers on first sidewalls of the first fuse gate and second spacers on second sidewalls of the first pass gate.

In some embodiments, a thickness of the insulating layer is between 25 Å to 30 Å, and a material of the insulating layer is silicon oxide.

In some embodiments, the electronic fuse device further includes a first polysilicon layer on the insulating layer and below the first fuse gate and a second polysilicon layer on the insulating layer and below the first pass gate.

In some embodiments, the electronic fuse device further includes a fourth doping region, a fifth doping region, a sixth doping region, a second fuse gate, a common electrode, a second pass gate, and a second readout electrode. The fourth doping region, the fifth doping region, and the sixth doping region are in the substrate, in which the fourth doping region is between the highly doped region and the fifth doping region, and the fifth doping region is between the fourth doping region and the sixth doping region. The second fuse gate is on the insulating layer and between the fourth doping region and the fifth doping region. The common electrode is electrically connected to the first fuse gate and the second fuse gate. The second pass gate is on the insulating layer and between the fifth doping region and the sixth doping region. The second readout electrode is electrically connected to the sixth doping region.

The present disclosure also provides a method of measuring a resistance of the electronic fuse device of any one of the above embodiments. The method includes the following operations. A first voltage is applied on the first pass gate. A second voltage is applied on the first fuse gate to break down the insulating layer. A third voltage is applied on the first pass gate. A fourth voltage is applied on the first fuse gate. A first resistance is read from the first readout electrode. If the first resistance is above a predetermined value, a fifth voltage is applied on the first pass gate, a sixth voltage higher than the fourth voltage is applied on the first fuse gate, and a second resistance is read from the first readout electrode.

In some embodiments, the fourth voltage is between 0.1 V to 0.5 V, and the sixth voltage is between 0.6 V to 1.0 V.

In some embodiments, the electronic fuse device further includes a fourth doping region, a fifth doping region, a sixth doping region, a second fuse gate, a common electrode, a second pass gate, and a second readout electrode. The fourth doping region, the fifth doping region, and the sixth doping region are in the substrate, in which the fourth doping region is between the highly doped region and the fifth doping region, and the fifth doping region is between the fourth doping region and the sixth doping region. The second fuse gate is on the insulating layer and between the fourth doping region and the fifth doping region. The common electrode is electrically connected to the first fuse gate and the second fuse gate. The second pass gate is on the insulating layer and between the fifth doping region and the sixth doping region. The second readout electrode is electrically connected to the sixth doping region.

In some embodiments, the method further includes the following operations. A seventh voltage is applied on the second pass gate. The second voltage is applied on the second fuse gate to break down the insulating layer. An eighth voltage is applied on the second pass gate. The fourth voltage is applied on the second fuse gate. A third resistance is read from the second readout electrode. If the third resistance is above the predetermined value, a ninth voltage is applied on the second pass gate, the sixth voltage is applied on the second fuse gate, and a fourth resistance is read from the second readout electrode.

The present disclosure yet also provides a method of forming electronic fuse device. The method includes the following operations. A first fuse gate and a first pass gate are formed on an insulating layer disposed on a substrate. A first ion implantation is performed to the substrate to form a first doping region, a second doping region, and a third doping region in the substrate, in which the second doping region is between the first doping region and the third doping region, the first fuse gate is between the first doping region and the second doping region, and the first pass gate is between the second doping region and the third doping region. A second ion implantation is performed to the substrate to form a highly doped region in the substrate, in which the first doping region is between the second doping region and the highly doped region. A first readout electrode is formed and electrically connected to the third doping region.

In some embodiments, the method further includes the following operations. A polysilicon layer is formed on the insulating layer before the first fuse gate and the first pass gate are formed. Portions of the polysilicon layer on the first doping region, the second doping region, and the third doping region are etched before the second ion implantation is performed to the substrate to form the highly doped region.

In some embodiments, the method further includes the following operation. First spacers on first sidewalls of the first fuse gate and second spacers on second sidewalls of the first pass gate are formed before the first ion implantation is performed to the substrate to form the first doping region, the second doping region, and the third doping region.

In some embodiments, the method further includes the following operation. A mask is formed to cover the first fuse gate, the first pass gate, the first doping region, the second doping region, and the third doping region before the second ion implantation is performed to the substrate to form the highly doped region.

In some embodiments, the method further includes the following operation. A third ion implantation is performed to the substrate to form a fourth doping region, a fifth doping region, and a sixth doping region, in which the fourth doping region is between the highly doped region and the fifth doping region, and the fifth doping region is between the fourth doping region and the sixth doping region.

In some embodiments, the method further includes the following operation. A second fuse gate and a second pass gate are formed, in which the second fuse gate is between the fourth doping region and the fifth doping region, and the second pass gate is between the fifth doping region and the sixth doping region.

In some embodiments, the method further includes the following operations. A common electrode is formed and electrically connected to the first fuse gate and the second fuse gate. A second readout electrode is formed and electrically connected to the sixth doping region.

BRIEF DESCRIPTION OF THE DRAWINGS

Aspects of the present disclosure are best understood from the following detailed description when reading with the accompanying figures. It is noted that, in accordance with the standard practice of the industry, various features are not drawn to scale. In fact, the dimensions of the various features may be arbitrarily increased or reduced for clarity of discussion.

FIG. 3 is a flow chart of a method of measuring a resistance of an electronic fuse device according to some embodiments of the present disclosure.

DETAILED DESCRIPTION

Figure 1:
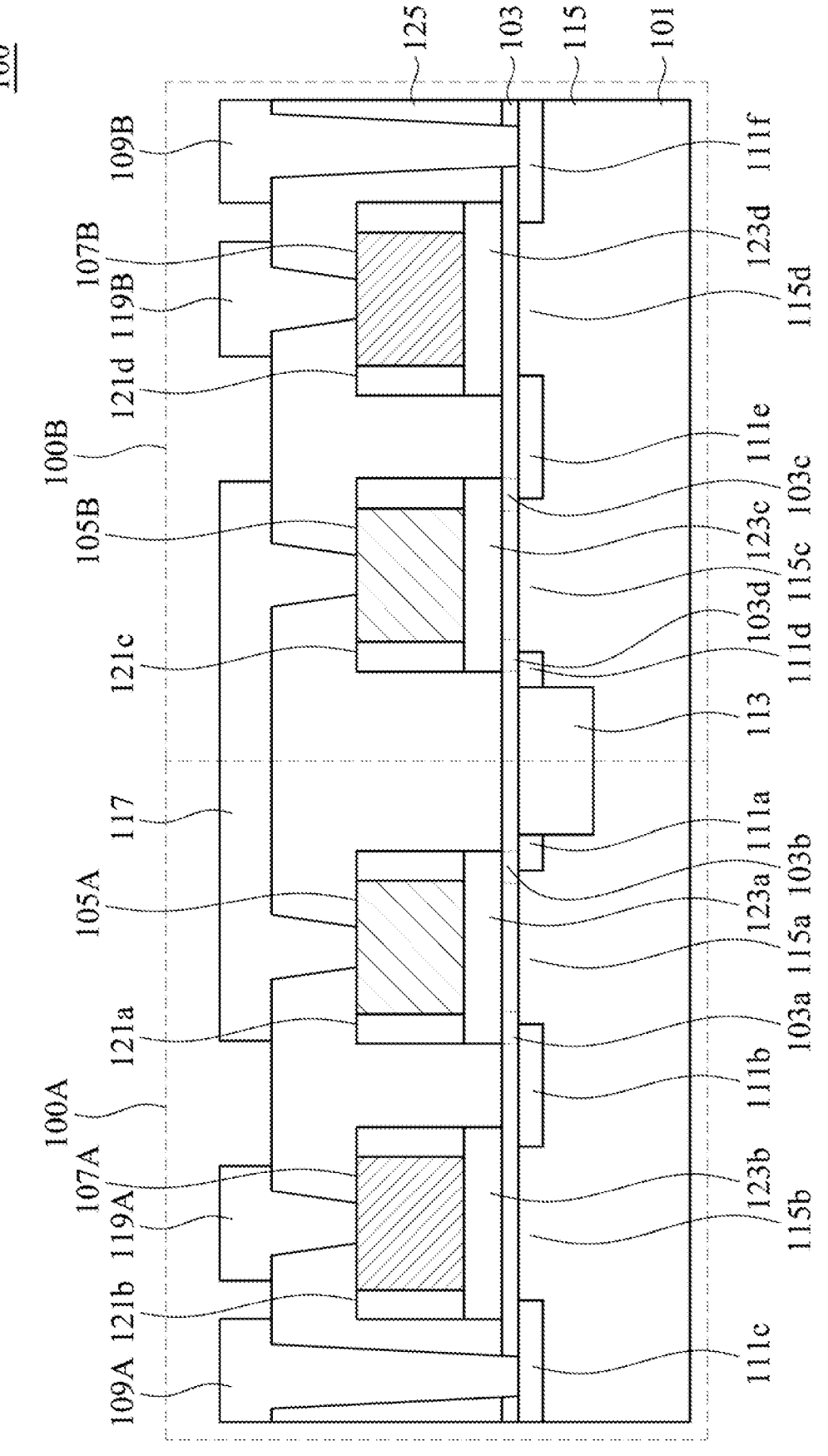
FIG. 1 is a cross-section view of an electronic fuse device according to some embodiments of the present disclosure.

To make the description of the present disclosure more detailed and complete, explanatory descriptions of the aspects and the specific implementations of the embodiments are provided below. They are not intended to limit the embodiments of the present disclosure to only one form. The embodiments of the present disclosure can be combined or substituted with each other under beneficial circumstances. Other embodiments can be appended without further description or explanation.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative terms used herein may likewise be interpreted accordingly. Throughout the discussion herein, unless otherwise specified, the same reference numeral in different figures refers to the same or similar component formed by a same or similar method using a same or similar material(s).

The present disclosure provides an electronic fuse device. The electronic fuse device includes a substrate, an insulating layer, a first fuse gate, a first pass gate, and a first readout electrode. The substrate includes a first doping region, a second doping region, a third doping region, and a highly doped region, in which the first doping region is between the second doping region and the highly doped region, the second doping region is between the first doping region and the third doping region, the first doping region, the second doping region, and the third doping region are a first conductivity type, and the highly doped region is a second conductivity type different from the first conductivity type. The insulating layer is positioned on the substrate. The first fuse gate is disposed on the insulating layer and between the first doping region and the second doping region. The first pass gate is disposed on the insulating layer and between the second doping region and the third doping region. The first readout electrode is electrically connected to the third doping region.

When a high voltage, referred to as a second voltage in the present disclosure in the following paragraphs, is applied to the first fuse gate, portions of the insulating layer that are next to the first fuse gate have the probability of blowing. The electronic fuse device of the present disclosure ensures all the blowing positions are detectable. Moreover, the electronic fuse device of the present disclosure is minimal.

Below are the detailed descriptions of the electronic fuse device according to some embodiments of the present disclosure.

Figure 2:
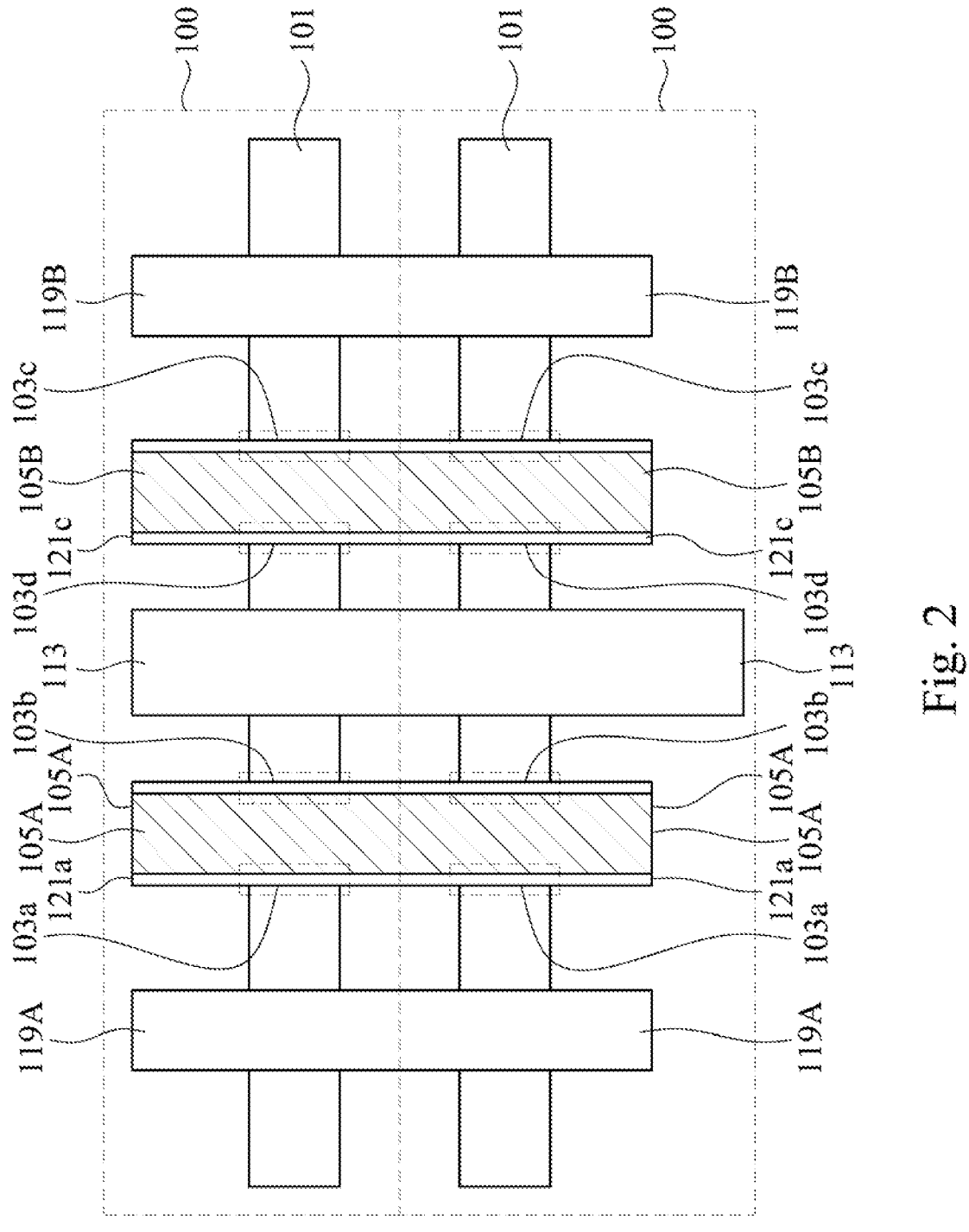
FIG. 2 is a top view of an electronic fuse device according to some embodiments of the present disclosure.

FIG. 1 is a cross-section view of an electronic fuse device 100 according to some embodiments of the present disclosure. FIG. 2 is a top view of the electronic fuse device 100 according to some embodiments of the present disclosure. In fact, two substantially identical electronic fuse devices 100 are displayed in FIG. 2. Each of the electronic fuse devices 100 is indicated in a corresponding dash line. One skilled in the art should understand that any number of the electronic fuse device 100 is within the scope of the present disclosure. In addition, some components in FIG. 1 are not drawn in FIG. 2 for ease of description.

The electronic fuse device 100 of the present disclosure includes a substrate 101, an insulating layer 103, a first fuse gate 105A, a first pass gate 107A, and a first readout electrode 109A. In some embodiments, the electronic fuse device 100 further includes a second fuse gate 105B, a second pass gate 107B, and a second readout electrode 109B. Below are the detailed descriptions of each component in the electronic fuse device 100.

The substrate 101 includes a first doping region 111a, a second doping region 111b, a third doping region 111c, a highly doped region 113, and a well region 115. As shown in FIG. 1, the first doping region 111a is between the second doping region 111b and the highly doped region 113, and the second doping region 111b is between the first doping region 111a and the third doping region 111c. In some embodiments, the substrate 101 further includes a fourth doping region 111d, a fifth doping region 111e, and a sixth doping region 111f. In these embodiments, the highly doped region 113 is between the first doping region 111a and the fourth doping region 111d, and the fifth doping region 111e is between the fourth doping region 111d and the sixth doping region 111f.

The first doping region 111a, the second doping region 111b, the third doping region 111c, the fourth doping region 111d, the fifth doping region 111e, and the sixth doping region 111f are regions of the substrate 101 doped with a dopant with a first conductivity type. They are separated by the well region 115 or the highly doped region 113 as shown in FIG. 1. Moreover, each of them has an upper surface exposed from the substrate 101, and in some embodiments, the upper surface directly contacts the insulating layer 103. In some embodiments, they are regions doped with an n-type dopant, such as phosphorus, arsenic, the like, or combinations thereof in a silicon substrate. In these embodiments, the first conductivity type is an n-type. In some embodiments, they are regions doped with a p-type dopant, such as boron, gallium, the like, or combinations thereof in a silicon substrate. In these embodiments, the first conductivity type is a p-type.

The highly doped region 113 is a region of the substrate 101 highly doped with a dopant with a second conductivity type that is different than the first conductivity type. The highly doped region 113 has an upper surface exposed from the substrate 101, and in some embodiments, the upper surface directly contacts the insulating layer 103. In some embodiments, the highly doped region 113 directly contacts the first doping region 111a and the fourth doping region 111d. In some embodiments, the highly doped region 113 is doped with an n-type dopant, such as phosphorus, arsenic, the like, or combinations thereof in a silicon substrate. In these embodiments, the second conductivity type is an n-type. In some embodiments, the highly doped region 113 is doped with a p-type dopant, such as boron, gallium, the like, or combinations thereof in a silicon substrate. In these embodiments, the second conductivity type is a p-type. In some embodiments, a first doping concentration of the highly doped region 113 is between $1 \times 10^{13}$ atoms/cm$^2$ and $1 \times 10^{15}$ atoms/cm$^2$.

The highly doped region 113 isolates the first fuse gate 105A, the first pass gate 107A, the first readout electrode 109A, and the components within a dash line box as shown in FIG. 1 as a single blowing and detecting first unit 100A. The highly doped region 113 avoids channel region of carriers (e.g., electrons and holes) flowing in and/or out of the first unit 100A to interfere with the blowing and detection in the first unit 100A. Therefore, with the design of the highly doped region 113, the detection accuracy of the blowing position enhances. In some embodiments, the highly doped region 113 between the first doping region 111a and the fourth doping region 111d isolates the first fuse gate 105A from the second fuse gate 105B. In these embodiments, the first fuse gate 105A in the first unit 100A and the second fuse gate 105B in a second unit 100B work independently in blowing and detecting the portions of the insulating layer 103 next to the first fuse gate 105A and the second fuse gate 105B, respectively. For ease of illustration, these portions are indicated as first portion 103a, second portion 103b, third portion 103c, and fourth portion 103d within dash line boxes of FIG. 1. The first unit 100A and the second unit 100B are substantially identical units arranged in a mirror-image configuration shown in FIG. 1. The units (e.g., the first unit 100A and the second unit 100B) isolated from each other provide multiple electric circuits to be selected simply by blowing portions of the insulating layer 103 in some units. For example, when the first portion 103a or the second portion 103b in the first unit 100A is blown to have an electrical short, and the third portion 103c and the fourth portion 103d in the second unit 100B are not blown to have an electrical short, carriers in the first unit 100A will have lower resistance compared with those in the second unit 100B, so the electric circuit changes.

Moreover, compared with other methods, for example, the one using shallow trench isolation, the highly doped region 113 of the present disclosure has a smaller dimension and is much easier to be implemented. Therefore, the electronic fuse device 100 of the present disclosure is also minimized and easier to be implemented.

The well region 115 is a region of the substrate 101 doped with a dopant with the second conductivity type. The well region 115 below the first fuse gate 105A is a first channel region 115a conducting the carriers between the first doping region 111a and the second doping region 111b. The well region 115 below the first pass gate 107A is a second channel region 115b conducting the carriers between the second doping region 111b and the third doping region 111c. The well region 115 below the second fuse gate 105B is a third channel region 115c conducting the carriers between the fourth doping region 111d and the fifth doping region 111e. The well region 115 below the second pass gate 107B is a fourth channel region 115d conducting the carriers between the fifth doping region 111e and the sixth doping region 111f. In some embodiments, the well region 115 is doped with an n-type dopant, such as phosphorus, arsenic, the like, or combinations thereof in a silicon substrate. In these embodiments, the second conductivity type is an n-type. In some embodiments, the well region 115 is doped with a p-type dopant, such as boron, gallium, the like, or combinations thereof in a silicon substrate. In these embodiments, the second conductivity type is a p-type. In some embodiments, the first doping concentration of the highly doped region 113 is greater than a second doping concentration of the well region 115. In some embodiments, the second doping concentration of the well region 115 is between $1\times10^{11}0.5$ atoms/cm$^2$ and $1\times10^{12}0.5$ atoms/cm$^2$, for example $1\times10^{12}$ atoms/cm$^2$.

The insulating layer 103 is positioned on the substrate 101. The insulating layer 103 includes the first portion 103a, the second portion 103b, the third portion 103c, and the fourth portion 103d as mentioned above. The first portion 103a and the second portion 103b that are next to the first fuse gate 105A overlap the second doping region 111b and the first doping region 111a respectively in a top view as shown within the dash line boxes indicated in FIG. 2. The third portion 103c and the fourth portion 103d that are next to the second fuse gate 105B overlap the fifth doping region 111e and the fourth doping region 111d respectively in a top view as shown within the dash line boxes indicated in FIG. 2. Each of the first portion 103a, the second portion 103b, the third portion 103c, and the fourth portion 103d has a probability of 85% to 95% to be blown out when the second voltage is applied to the first fuse gate 105A and the second fuse gate 105B (details will be discussed later). The electronic fuse device 100 of the present disclose ensures all the first portion 103a, the second portion 103b, the third portion 103c, and the fourth portion 103d are detectable and therefore further ensures all the portions that should be blown are blown to have electrical short. In some embodiments, a thickness of the insulating layer 103 is between 25 Å to 30 Å, and a material of the insulating layer 103 is silicon oxide.

In the first unit 100A, the first fuse gate 105A is between the first doping region 111a and the second doping region 111b. The first pass gate 107A is between the second doping region 111b and the third doping region 111c. The first readout electrode 109A is electrically connected to the third doping region 111c. The first fuse gate 105A is designed to (a) trigger the blow of the first portion 103a and the second portion 103b when the second voltage is applied to the first fuse gate 105A, (b) detect if the first portion 103a is blown to have an electrical short when a fourth voltage is applied to the first fuse gate 105A, and (c) detect if the second portion 103b is blown to have an electrical short when a sixth voltage is applied to the first fuse gate 105A. The first pass gate 107A is designed to trigger the opening of the second channel region 115b when the above-mentioned second, fourth, and sixth voltages are applied to the first fuse gate 105A. If the first pass gate 107A is not triggered to open the second channel region 115b, the blow of the first portion 103a and the second portion 103b will not happen, and currents flowing through the first portion 103a and the second portion 103b are not detectable. In other words, the first pass gate 107A actively controls the blow of the first portion 103a and the second portion 103b to make changes to the electric circuit. The first readout electrode 109A is designed to read resistance of the first unit 100A. Details will be further discussed in following paragraphs. In some embodiments, the first fuse gate 105A and the first pass gate 107A are metal gates. In some embodiments, the first readout electrode 109A is a metal electrode.

In the second unit 100B, the second fuse gate 105B is between the fourth doping region 111d and the fifth doping region 111e. The second pass gate 107B is between the fifth doping region 111e and the sixth doping region 111f. The second readout electrode 109B is electrically connected to the sixth doping region 111f. The second fuse gate 105B is designed to (a) trigger the blow of the third portion 103c and the fourth portion 103d when the second voltage is applied to the second fuse gate 105B, (b) detect if the third portion 103c is blown to have an electrical short when the fourth voltage is applied to the second fuse gate 105B, and (c) detect if the fourth portion 103d is blown to have an electrical short when the sixth voltage is applied to the second fuse gate 105B. The second pass gate 107B is designed to trigger the opening of the fourth channel region 115d when the above-mentioned second, fourth, and sixth voltages are applied to the second fuse gate 105B. If the second pass gate 107B is not triggered to open the fourth channel region 115d, the blow of the third portion 103c and the fourth portion 103d will not happen, and currents flowing through the third portion 103c and the fourth portion 103d are not detectable. In other words, the second pass gate 107B actively controls the blow of the third portion 103c and the fourth portion 103d to make changes to the electric circuit. The second readout electrode 109B is designed to read resistance of the second unit 100B. Details will be further discussed in following paragraphs. In some embodiments, the second fuse gate 105B and the second pass gate 107B are metal gates. In some embodiments, the second readout electrode 109B is a metal electrode.

The electronic fuse device 100 further includes a common electrode 117 and a first pass gate electrode 119A. The common electrode 117 electrically connects to the first fuse gate 105A to apply voltages, such as the second, fourth, and sixth voltages. The first pass gate electrode 119A electrically connects to the first pass gate 107A to apply voltages, e.g., a first voltage, a third voltage, and a fifth voltage, which will be discussed later. In some embodiments, the electronic fuse device 100 further includes a second pass gate electrode 119B. In these embodiments, the common electrode 117 further electrically connects to the second fuse gate 105B to apply voltages, such as the second, fourth, and sixth voltages. In these embodiments, the common electrode 117 electrically connects to both the first fuse gate 105A and the second fuse gate 105B, which makes the electronic fuse device 100 much easier to be implemented and also reduces the dimension of the electronic fuse device 100. The second pass gate electrode 119B electrically connects to the second pass gate 107B to apply voltages, e.g., a seventh voltage, an eighth voltage, and a ninth voltage discussed later, which will be discussed later. In some embodiments, the first/second pass gate electrode 119A/119B of one electronic fuse device 100 connects to the first/second pass gate electrode 119A/119B of another electronic fuse device 100 as shown in FIG. 2. However, in some embodiments, the first/second pass gate electrode 119A/119B of one electronic fuse device 100 does not connect to the first/second pass gate electrode 119A/119B of another electronic fuse device 100 (not shown in figures). Whether to connect one first/second pass gate electrode 119A/119B to another first/second pass gate electrode 119A/119B is dependent on the design requirement. In some embodiments, the common electrode 117, the first pass gate electrode 119A, and the second pass gate electrode 119B are metal electrodes.

The electronic fuse device 100 further includes first spacers 121a on first sidewalls of the first fuse gate 105A, second spacers 121b on second sidewalls of the first pass gate 107A, third spacers 121c on third sidewalls of the second fuse gate 105B, and fourth spacers 121d on fourth sidewalls of the second pass gate 107B. These spacers provide tolerance for the diffusion of the first doping region 111a, the second doping region 111b, the third doping region 111c, the fourth doping region 111d, the fifth doping region 111e, and the sixth doping region 111f. Therefore, these spacers ensure that the first doping region 111a, the second doping region 111b, the third doping region 111c, the fourth doping region 111$d$, the fifth doping region 111$e$, and the sixth doping region 111$f$ are not formed right underneath the first fuse gate 105A, the first pass gate 107A, the second fuse gate 105B, and the second pass gate 107B, which interferes with carriers flowing in the first channel region 115$a$, the second channel region 115$b$, the third channel region 115$c$, and the fourth channel region 115$d$. In some embodiments, the first spacers 121$a$, the second spacers 121$b$, the third spacers 121$c$, and the fourth spacers 121$d$ are silicon nitride.

The electronic fuse device 100 further includes a first polysilicon layer 123$a$, a second polysilicon layer 123$b$, a third polysilicon layer 123$c$, and a fourth polysilicon layer 123$d$, respectively below the first fuse gate 105A, the first pass gate 107A, the second fuse gate 105B, and the second pass gate 107B. In some other embodiments, these polysilicon layer are omitted, and the gates and the spacers are in direct contact with the insulating layer 103. The electronic fuse device 100 further includes a dielectric layer 125 to insulate the components, such as the first fuse gate 105A, the first pass gate 107A, the first readout electrode 109A, etc.

The present disclosure also provides a method of measuring a resistance of the above-described electronic fuse device 100. Details of the electronic fuse device 100 can refer to the above description and will not repeat hereafter. FIG. 3 is a flow chart of a method 200 of measuring the resistances of the electronic fuse device 100 according to some embodiments of the present disclosure. The method 200 includes operation 202, operation 204, operation 206, operation 208, operation 210, and operation 212. Below are the detailed descriptions of each operation in the method 200. The method 200 includes the following operations. The first voltage is applied on the first pass gate 107A. The second voltage is applied on the first fuse gate 105A to break down the insulating layer 103. The third voltage is applied on the first pass gate 107A. The fourth voltage is applied on the first fuse gate 105A. A first resistance is read from the first readout electrode 109A. If the first resistance is above a predetermined value, the fifth voltage is applied on the first pass gate 107A, the sixth voltage higher than the fourth voltage is applied on the first fuse gate 105A, and a second resistance is read from the first readout electrode 109A. Below are the detailed descriptions of the method 200 according to some embodiments of the present disclosure.

In operation 202, the first voltage is applied on the first pass gate 107A. When the first voltage is higher than a threshold value, the second channel region 115$b$ opens, and the first portion 103$a$ and second portion 103$b$ can be blown by applying the second voltage on the first fuse gate 105A in operation 204. When the first voltage is lower than the threshold value, the second channel region 115$b$ is closed, and the first portion 103$a$ and second portion 103$b$ cannot be blown by applying the second voltage on the first fuse gate 105A in operation 204. Operation 202 controls whether to blow the first portion 103$a$ and second portion 103$b$ in operation 204. In some embodiments, the threshold value is between 1.0 V to 1.4 V.

In operation 204, the second voltage is applied on the first fuse gate 105A to break down or blow out the insulating layer 103. When the second voltage is higher than a threshold value, and the second channel region 115$b$ is open in operation 202, the first portion 103$a$ and second portion 103$b$ have the probability to be blown to have an electrical short. When the second voltage is higher than the threshold value, but the second channel region 115$b$ is closed in operation 202, the first portion 103$a$ and second portion 103$b$ are not blown. When the second voltage is lower than the threshold value, whether the second channel region 115$b$ in operation 202 is open or closed, the first portion 103$a$ and second portion 103$b$ are not blown. In some embodiments, the threshold value is between 3 V to 4 V.

In operation 206, the third voltage is applied on the first pass gate 107A. When the third voltage is higher than a threshold value, the second channel region 115$b$ opens, and whether the first portion 103$a$ is blown to have an electrical short can be detected by applying the fourth voltage on the first fuse gate 105A in operation 208. When the third voltage is lower than the threshold value, the second channel region 115$b$ is closed, and whether the first portion 103$a$ is blown to have an electrical short cannot be detected by applying the fourth voltage on the first fuse gate 105A in operation 208. Operation 206 controls whether to detect the blow of the first portion 103$a$. In some embodiments, the threshold value is between 1.0 V to 1.4 V.

In operation 208, the fourth voltage is applied on the first fuse gate 105A. When the fourth voltage is within a range smaller than the sixth voltage, and the second channel region 115$b$ is open in operation 206, whether the first portion 103$a$ is blown to have an electrical short is detectable. No matter what the value of the fourth voltage is if the second channel region 115$b$ is closed in operation 206, the first portion 103$a$ is not detectable. In some embodiments, the range is between 0.1 V to 0.5 V.

In operation 210, a first resistance is read from the first readout electrode 109A. In the case that the first portion 103$a$ is detectable in operation 208, the first resistance is read to see if the first portion 103$a$ is blown to have an electrical short. When the first resistance is below a predetermined value, operation 212 is not necessary to conduct, because at least a portion of the insulating layer 103 under the first fuse gate 105A (i.e., the first portion 103$a$) is electrically short, and the electric circuit has changed. When the first resistance is above the predetermined value, operation 212 is necessary to conduct. The predetermined value is not limited to any value. A smaller predetermined value ensures a more accurate detection but may have a higher probability of deciding the first portion 103$a$ is not blown out, which may cause a longer detection time by proceeding to operation 212 or blowing the first portion 103$a$ again in operation 204. In some embodiments, the predetermined value is between 5 k$\Omega$ to 15 k$\Omega$. In some embodiments, the predetermined value is between 15 k$\Omega$ to 25 k$\Omega$. In some embodiments, the predetermined value is between 25 k$\Omega$ to 35 k$\Omega$. In some embodiments, the predetermined value is between 35 k$\Omega$ to 45 k$\Omega$. In some embodiments, the predetermined value is between 45 k$\Omega$ to 55 k$\Omega$.

Figure 4:
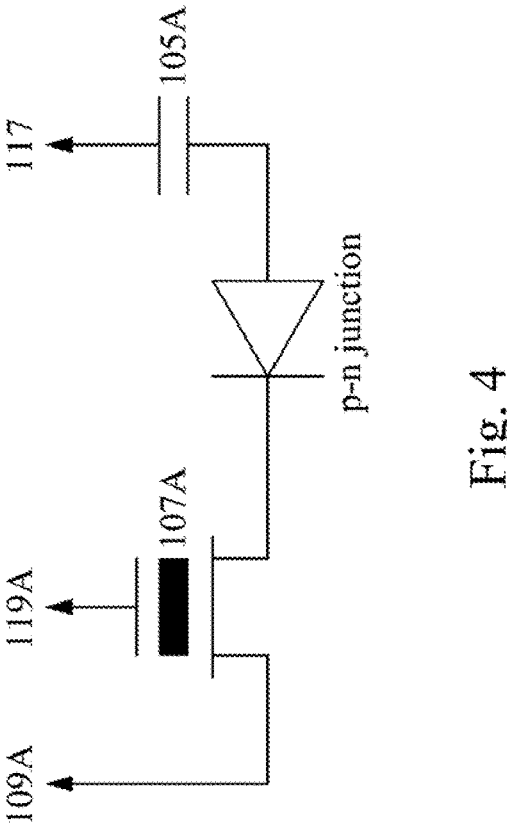
FIG. 4 is a circuit diagram with a p-n junction in an electronic fuse device according to some embodiments of the present disclosure.

In operation 212, if the first resistance is above the predetermined value, the fifth voltage is applied on the first pass gate 107A, the sixth voltage higher than the fourth voltage is applied on the first fuse gate 105A, and a second resistance is read from the first readout electrode 109A. In operation 210, the second portion 103$b$ is not detectable because a p-n junction is in the first channel region 115$a$ between the first doping region 111$a$ and the second doping region 111$b$ (as shown in the electric circuit of FIG. 4). However, in operation 212, the second portion 103$b$ can be detectable. When the fifth voltage is higher than a threshold value, the second channel region 115$b$ opens, and when the sixth voltage is within a range higher than the fourth voltage, whether the second portion 103$b$ is blown to have an electrical short is detectable. When the fifth voltage is lower than the threshold value, no matter what the value of the sixth voltage is, the second portion 103$b$ is not detectable. The fifth voltage controls whether to detect the blow of the second portion 103$b$. The sixth voltage controls whether to make the p-n junction between the first doping region 111*a* and the second doping region 111*b* become conductible so that the second portion 103*b* is detectable. In some embodiments, the above-mentioned threshold value is between 1.0 V to 1.4 V. In some embodiments, the above-mentioned range is between 0.6 V to 1.0 V.

Figure 5:
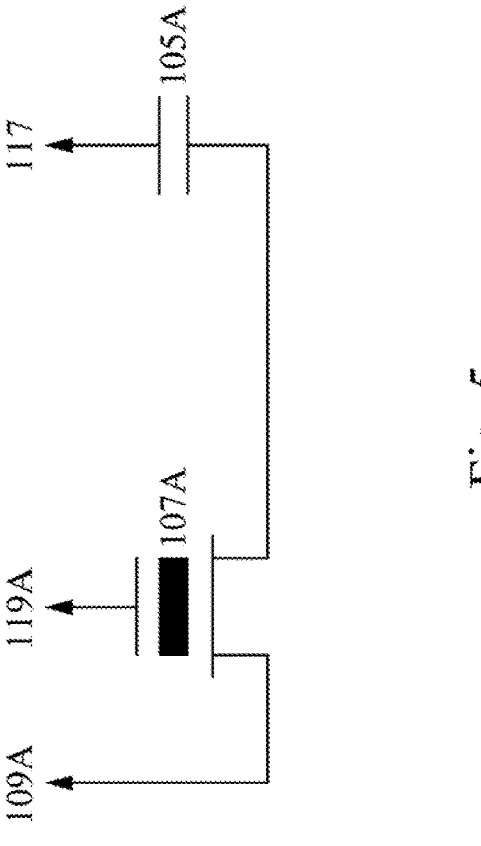
FIG. 5 is a circuit diagram without a p-n junction in an electronic fuse device according to some embodiments of the present disclosure.

In operation 212, in the case that the second portion 103*b* is detectable without a p-n junction in the first channel region 115*a* (as shown in the electric circuit of FIG. 5), the second resistance is read to see if the second portion 103*b* is blown to have an electrical short. When the second resistance is below a predetermined value, the second portion 103*b* under the first fuse gate 105A is electrically short and the electric circuit changes. When the second resistance is above the predetermined value, operation 202 to operation 212 may be performed again. The predetermined value is not limited to any value and may be the same predetermined value in operation 210 for the same consideration, which is not repeated herein.

In the method 200 of the present disclosure, operation 212 makes the second portion 103*b* detectable and avoids missing the detection position other than the first portion 103*a*. In addition, because the second portion 103*b* is detectable in operation 212, the present disclosure avoids having another pass gate and the readout electrode on the side of the first fuse gate 105A opposite the side of the first pass gate 107A and the first readout electrode 109A in the first unit 100A. Therefore, the present disclosure has a minimal electronic fuse device and the implementation and the usage of the electronic fuse device are much easier.

In some embodiments, the electronic fuse device 100 further includes the second unit 100B. The details of the second unit 100B have been discussed above and will not be repeated hereafter. In these embodiments, the method 200 further includes the following operations. A seventh voltage is applied on the second pass gate 107B. The second voltage is applied on the second fuse gate 105B to break down the insulating layer 103. An eighth voltage is applied on the second pass gate 107B. The fourth voltage is applied on the second fuse gate 105B. A third resistance is read from the second readout electrode 109B. If the third resistance is above the predetermined value, a ninth voltage is applied on the second pass gate 107B, the sixth voltage is applied on the second fuse gate 105B, and a fourth resistance is read from the second readout electrode 109B. These operations are similar to operation 202 to operation 212 in addition to the blowing and the detection is performed in the second unit 100B instead of the first unit 100A. For the simplicity of the description, details of the operations refer to operation 202 to operation 212, in which the seventh voltage corresponds to the first voltage, the eighth voltage corresponds to the third voltage, the ninth voltage corresponds to the fifth voltage, and so on.

Figure 6:
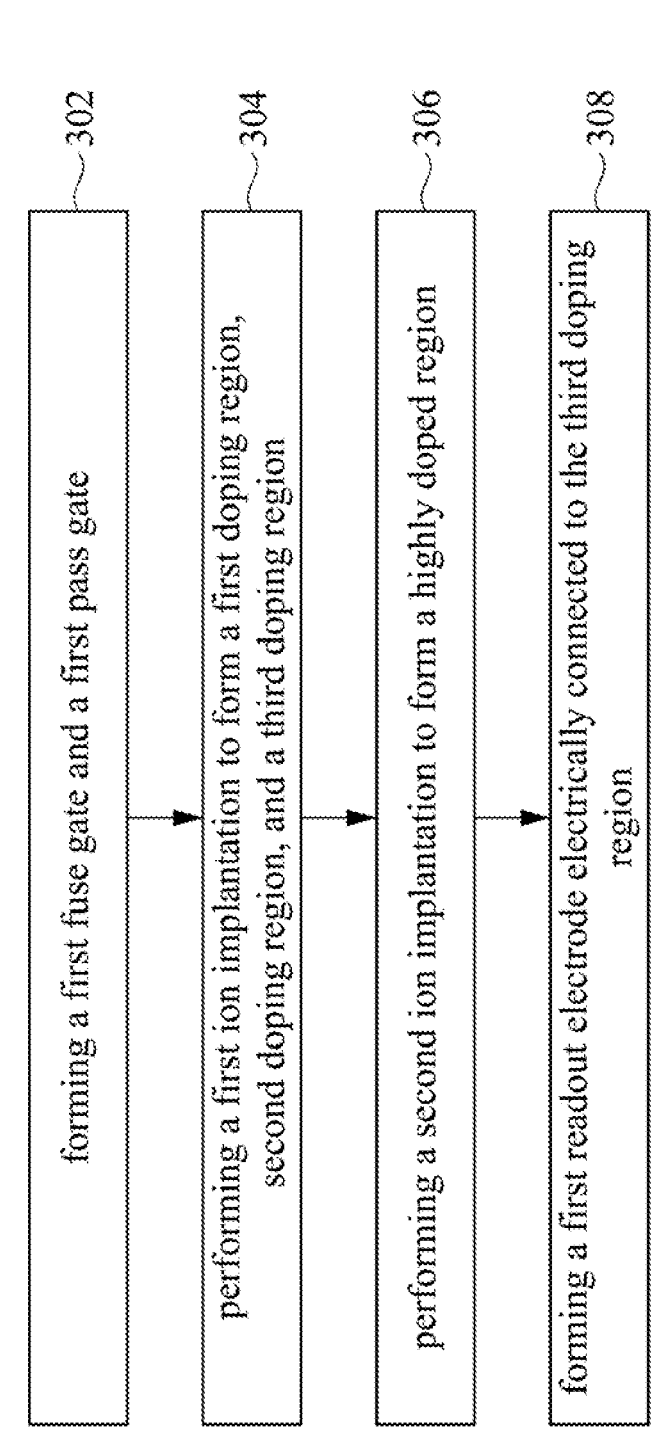
FIG. 6 is a flow chart of a method forming an electronic fuse device according to some embodiments of the present disclosure.

The present disclosure yet also provides a method of forming the above-described electronic fuse device 100. FIG. 6 is a flow chart of a method 300 forming the electronic fuse device 100 according to some embodiments of the present disclosure. FIGS. 7 to 10 are cross-section views of the electronic fuse device 100 at the intermediate stages of the method 300 according to some embodiments of the present disclosure. The method 300 includes operation 302, operation 304, operation 306, and operation 308. Below are the detailed descriptions of each operation in the method 300. The method 300 includes the following operations. The first fuse gate 105A and the first pass gate 107A are formed on the insulating layer 103 disposed the substrate 101. A first ion implantation is performed to the substrate 101 to form the first doping region 111*a*, the second doping region 111*b*, and the third doping region 111*c* in the substrate 101, in which the second doping region 111*b* is between the first doping region 111*a* and the third doping region 111*c*, the first fuse gate 105A is between the first doping region 111*a* and the second doping region 111*b*, and the first pass gate 107A is between the second doping region 111*b* and the third doping region 111*c*. A second ion implantation is performed to the substrate 101 to form the highly doped region 113 in the substrate 101, in which the first doping region 111*a* is between the second doping region 111*b* and the highly doped region 113. The first readout electrode 109A is formed and electrically connected to the third doping region 111*c*. Below are the detailed descriptions of the method 300 according to some embodiments of the present disclosure.

Figure 7:
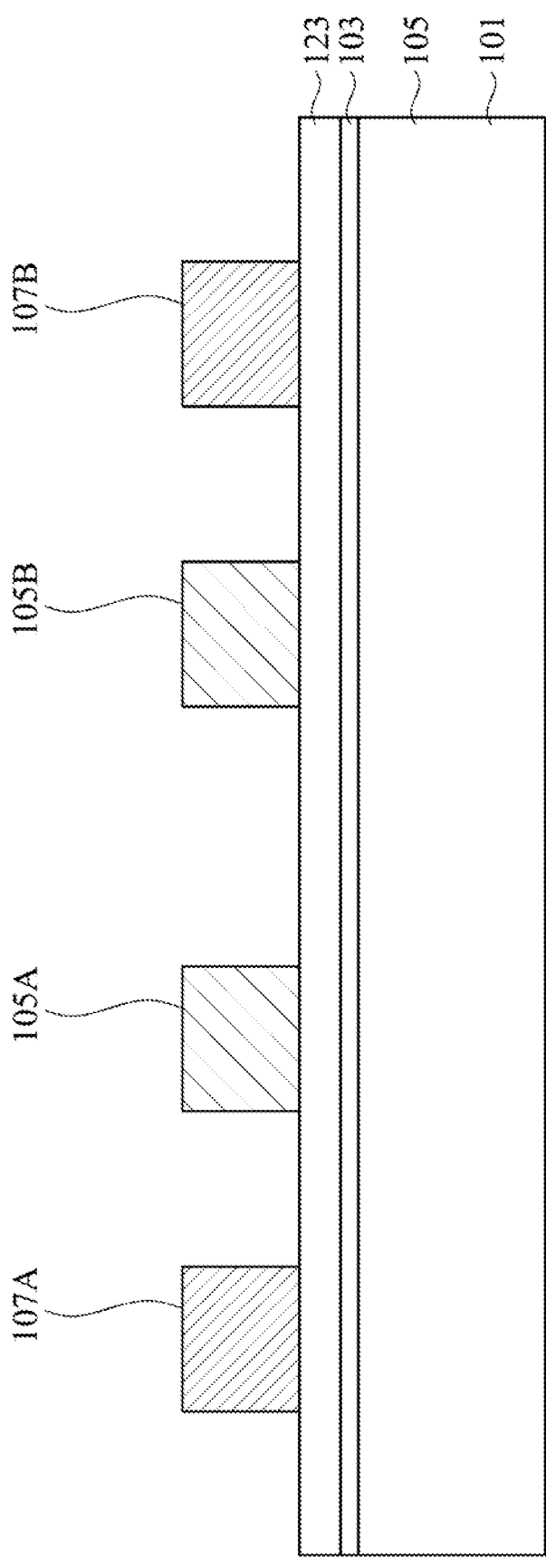
FIGS. 7 to 10 are cross-section views of an electronic fuse device at the intermediate stages of forming the electronic fuse device according to some embodiments of the present disclosure.

In operation 302, the first fuse gate 105A and the first pass gate 107A are formed on the insulating layer 103 disposed on the substrate 101 (shown in FIG. 7). In some embodiments, operation 302 further includes forming the second fuse gate 105B and the second pass gate 107B on the insulating layer 103 disposed on the substrate 101. In some embodiments, a metal layer is formed on the insulating layer 103 by a deposition process and etched later to form the first/second fuse gate 105A/105B and the first/second pass gate 107A/107B. In these embodiments, a material of the first/second fuse gate 105A/105B and a material of the first/second pass gate 107A/107B are the same. In some embodiments, one metal layer is formed on the insulating layer 103 by a deposition process and etched later to form the first/second fuse gate 105A/105B, and another metal layer is formed on the insulating layer 103 by a deposition process and etched later to form the first/second pass gate 107A/107B. In these embodiments, a material of the first/second fuse gate 105A/105B and a material of the first/second pass gate 107A/107B can be different. In some embodiments, the first/second fuse gate 105A/105B and the first/second pass gate 107A/107B are formed on a polysilicon layer 123 on the insulating layer 103 disposed on the substrate 101. In some other embodiments, the polysilicon layer 123 is omitted. In some embodiments, the substrate 101 in operation 302 is a substrate having the well region 115 doped with a dopant with the second conductivity type.

Before operation 304, the method 300 further includes the following operation. First spacers 121*a* on first sidewalls of the first fuse gate 105A and second spacers 121*b* on second sidewalls of the first pass gate 107A are formed by a deposition process (shown in FIG. 8). In some embodiments, third spacers 121*c* on third sidewalls of the second fuse gate 105B and fourth spacers 121*d* on fourth sidewalls of the second pass gate 107B are also formed by a deposition process. As described in the previous paragraphs, these spacers provide tolerance for the diffusion of the first doping region 111*a*, the second doping region 111*b*, the third doping region 111*c*, the fourth doping region 111*d*, the fifth doping region 111*e*, and the sixth doping region 111*f*, which are formed in operation 304. In some embodiments, the deposition process is an atomic layer deposition.

Figure 8:
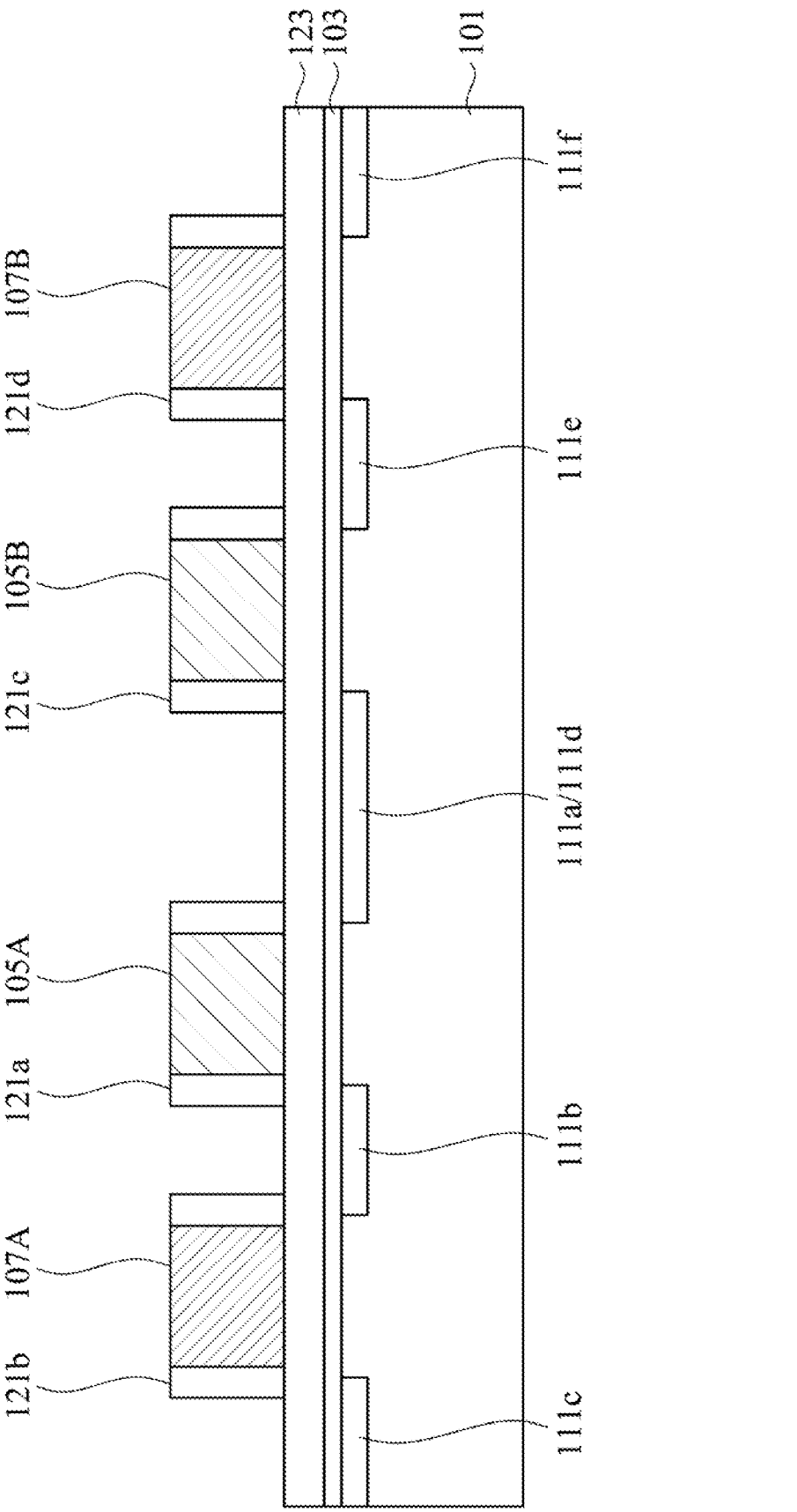
Figure 9:
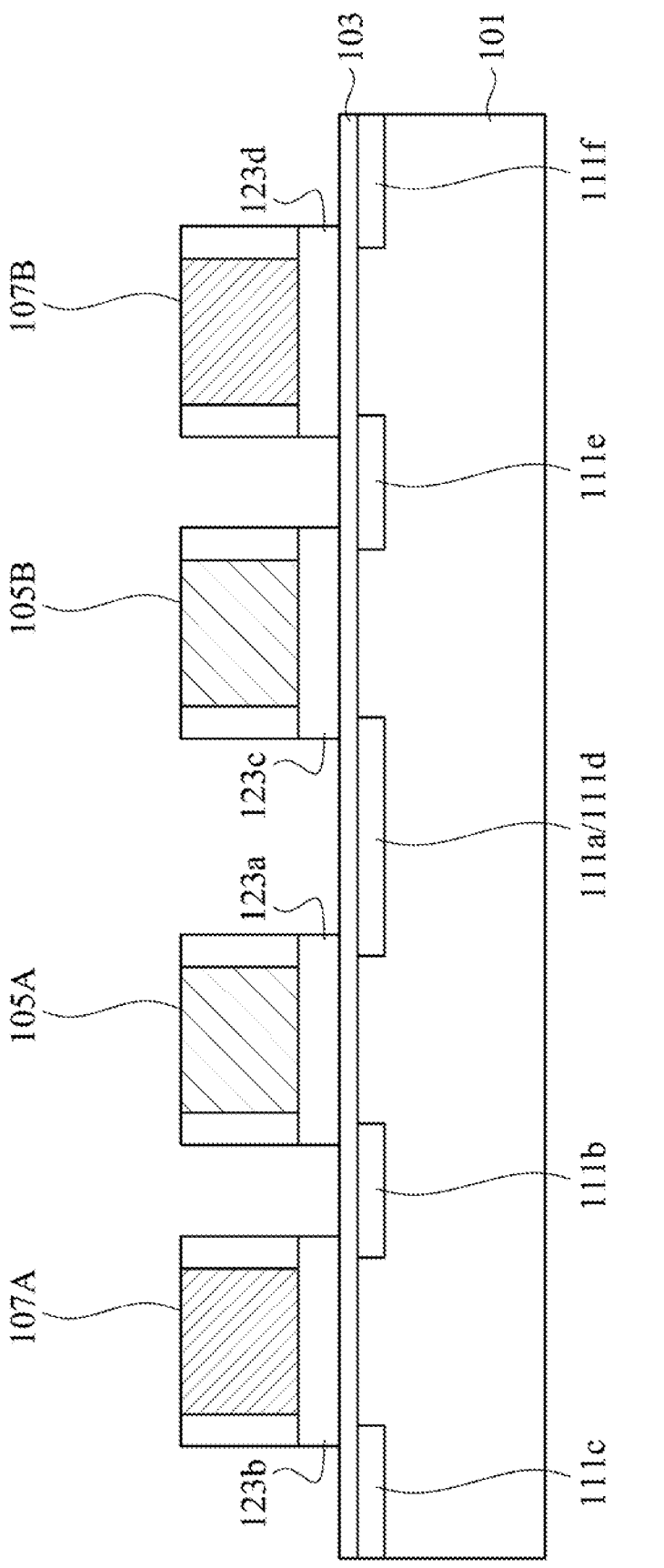

In operation 304, the first ion implantation is performed to the substrate 101 to form the first doping region 111*a*, the second doping region 111*b*, and the third doping region 111*c*, in which the second doping region 111*b* is between the first doping region 111*a* and the third doping region 111*c*, the first fuse gate 105A is between the first doping region 111*a* and the second doping region 111*b*, and the first pass gate 107A is between the second doping region 111*b* and the third doping region 111*c* (shown in FIG. 8). In some embodiments, operation 302 further includes performing a third ion implantation to the substrate 101 to form the fourth doping region 111*d*, the fifth doping region 111*e*, and the sixth doping region 111*f*, in which the fifth doping region 111*e* is between the fourth doping region 111*d* and the sixth doping region 111*f*. In some embodiments, the fourth doping region 111*d* is not formed in operation 304 and the first doping region 111*a* is also the fourth doping region 111*d* in operation 304 (shown in FIG. 8). In these embodiments, the fourth doping region 111*d*, separated from the first doping region 111*a*, is formed in operation 306 by forming the highly doped region 113 between the first doping region 111*a* and the fourth doping region 111*d*. In operation 306 discussed later, the fourth doping region 111*d* is between the highly doped region 113 and the fifth doping region 111*e*. In the embodiments forming the second fuse gate 105B and the second pass gate 107B in operation 302, the second fuse gate 105B is between the fourth doping region 111*d* and the fifth doping region 111*e*, and the second pass gate 107B is between the fifth doping region 111*e* region and the sixth doping region 111*f*. In some embodiments, the first doping region 111*a*, the second doping region 111*b*, the third doping region 111*c*, the fourth doping region 111*d*, the fifth doping region 111*e*, and the sixth doping region 111*f* are regions of the substrate 101 doped with a dopant with the first conductivity type in the first ion implantation.

Before operation 306, the method 300 further includes the following operation. Portions of the polysilicon layer 123 on the first doping region 111*a*, the second doping region 111*b*, and the third doping region 111*c* are etched to form the first polysilicon layer 123*a* and the second polysilicon layer 123*b* (shown in FIG. 9). In some embodiments, portions of the polysilicon layer 123 on the fourth doping region 111*d*, the fifth doping region 111*e*, and the sixth doping region 111*f* are etched to form the third polysilicon layer 123*c* and the fourth polysilicon layer 123*d*.

Figure 10:
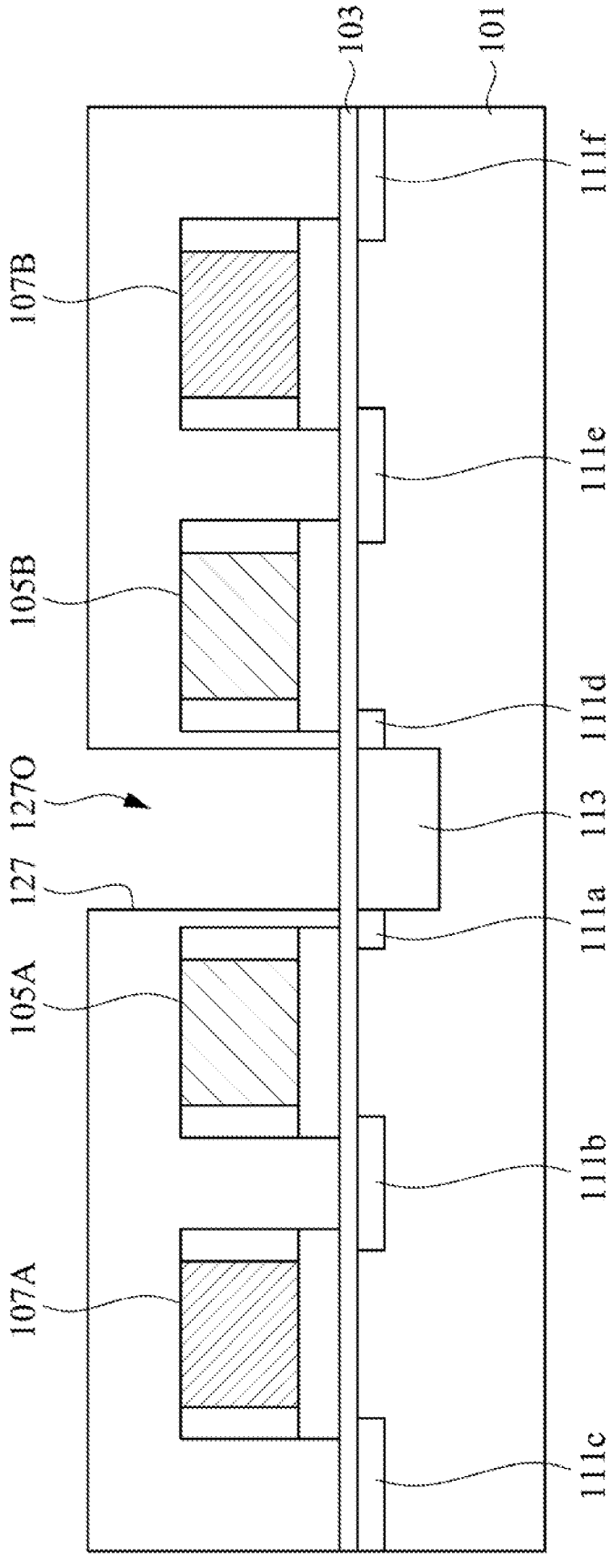

In operation 306, the second ion implantation is performed to the substrate 101 to form the highly doped region 113 (shown in FIG. 10). In some embodiments, a mask 127 is formed to cover the first fuse gate 105A, the first pass gate 107A, the first doping region 111*a*, the second doping region 111*b*, and the third doping region 111*c* before the second ion implantation. In some embodiments, the mask 127 is formed to also cover the second fuse gate 105B, the second pass gate 107B, the fourth doping region 111*d*, the fifth doping region 111*e*, and the sixth doping region 111*f* before the second ion implantation. The mask 127 has an opening 1270 defining the position to perform the second ion implantation to form the highly doped region 113. In some embodiments, the opening 1270 is between the first doping region 111*a* and the fourth doping region 111*d*. In the embodiments that the first doping region 111*a* is also the fourth doping region 111*d* in operation 304, the opening 1270 is on a middle portion of the first doping region 111*a* or the fourth doping region 111*d*. In these embodiments, after the second ion implantation, the first doping region 111*a* and the fourth doping region 111*d* are separated by the highly doped region 113.

Please refer to FIG. 1. In operation 308, the first readout electrode 109A is formed and electrically connected to the third doping region 111*c*. In some embodiments, operation 308 further includes forming the common electrode 117 electrically connected to the first fuse gate 105A and the second fuse gate 105B, forming the first/second pass gate electrode 119A/119B electrically connected to the first/second pass gate 107A/107B, and forming the second readout electrode 109B electrically connected to the sixth doping region 111*f*. In some embodiments, the dielectric layer 125 is formed on the first/second fuse gate 105A/105B and the first/second pass gate 107A/107B by a deposition process. Portions of the dielectric layer 125 on the first/second fuse gate 105A/105B, the first/second pass gate 107A/107B, and the third/sixth doping region 111*c*/111*f* are etched and later filled with the deposition of the common electrode 117, the first/second pass gate electrode 119A/119B, and the first/second readout electrode 109A/109B. After operation 308, the electronic fuse structure 100 as shown in FIG. 1 is formed.

The electronic fuse device of the present disclosure ensures all the blowing positions are detectable. Moreover, the electronic fuse device of the present disclosure is minimal.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. An electronic fuse device, comprising:
   a substrate comprising a first doping region, a second doping region, a third doping region, and a highly doped region, wherein the first doping region is between the second doping region and the highly doped region, the second doping region is between the first doping region and the third doping region, the first doping region, the second doping region, and the third doping region are a first conductivity type, and the highly doped region is a second conductivity type different from the first conductivity type;
   an insulating layer positioned on the substrate;
   a first fuse gate disposed on the insulating layer and between the first doping region and the second doping region;
   a first pass gate disposed on the insulating layer and between the second doping region and the third doping region;
   a first readout electrode electrically connected to the third doping region;
   a first polysilicon layer disposed between the first fuse gate and the insulating layer; and
   first spacers disposed on the first polysilicon layer and covering first sidewalls of the first fuse gate, wherein external surfaces of sidewalls of the first spacers are aligned with external surfaces of sidewalls of the first polysilicon layer.

2. The electronic fuse device of claim 1, wherein the first doping region is in direct contact with the highly doped region.

3. The electronic fuse device of claim 1, wherein the substrate further comprises a well region surrounding the first doping region, the second doping region, and the third doping region, the well region has the second conductivity type, and a first doping concentration of the highly doped region is greater than a second doping concentration of the well region.

4. The electronic fuse device of claim 1, further comprising second spacers on second sidewalls of the first pass gate.

5. The electronic fuse device of claim 1, wherein a thickness of the insulating layer is between 25 Å to 30 Å, and a material of the insulating layer is silicon oxide.

6. The electronic fuse device of claim 1, further comprising a second polysilicon layer on the insulating layer and below the first pass gate.

7. The electronic fuse device of claim 1, further comprising:

a fourth doping region, a fifth doping region, and a sixth doping region in the substrate, wherein the fourth doping region is between the highly doped region and the fifth doping region, and the fifth doping region is between the fourth doping region and the sixth doping region;

a second fuse gate on the insulating layer and between the fourth doping region and the fifth doping region;

a common electrode electrically connected to the first fuse gate and the second fuse gate;

a second pass gate on the insulating layer and between the fifth doping region and the sixth doping region; and a second readout electrode electrically connected to the sixth doping region.

8. The electronic fuse device of claim 1, wherein the insulating layer is disposed between the first spacers and the substrate.

9. The electronic fuse device of claim 1, wherein the second doping region is in contact with the insulating layer.

\* \* \* \* \*